United States Patent
Ge et al.

(10) Patent No.: US 9,698,731 B2
(45) Date of Patent: Jul. 4, 2017

(54) POWER AMPLIFIER, TRANSCEIVER, AND BASE STATION

(71) Applicant: Huawei Technologies Co., Ltd., Shenzhen, Guangdong (CN)

(72) Inventors: Liming Ge, Shanghai (CN); Jie Sun, Shanghai (CN); Yongge Su, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/816,487

(22) Filed: Aug. 3, 2015

(65) Prior Publication Data
US 2015/0340996 A1 Nov. 26, 2015

Related U.S. Application Data

(63) Continuation of application No. PCT/CN2013/071333, filed on Feb. 4, 2013.

(51) Int. Cl.
*H03F 3/68* (2006.01)
*H03F 1/02* (2006.01)
(Continued)

(52) U.S. Cl.
CPC ......... *H03F 1/0288* (2013.01); *H03F 1/0222* (2013.01); *H03F 3/189* (2013.01);
(Continued)

(58) Field of Classification Search
CPC .... H03F 1/26; H03F 3/45479; H03F 220/267; H03F 2200/129; H03F 2203/45061;
(Continued)

(56) References Cited

U.S. PATENT DOCUMENTS 6,097,252 A    8/2000 Sigmon et al.
2004/0174212 A1*  9/2004 Kim ..................... H03F 1/0288
                                                    330/124 R
(Continued)

FOREIGN PATENT DOCUMENTS

CN          1866733 A  * 11/2006
CN        101510760 A      8/2009
(Continued)

*Primary Examiner* — Steven J Mottola
*Assistant Examiner* — Hafizur Rahman

(57) ABSTRACT

Embodiments of the present invention provide a power amplifier, a transceiver, and a base station. The power amplifier includes: a signal control unit, configured to generate a mode control signal and an auxiliary power amplifier control signal; a signal processing unit, configured to separately process an envelope signal and a radio-frequency signal; an envelope modulator, configured to output a fixed voltage or output an amplified envelope signal under the control of the mode control signal; a primary power amplifier, configured to perform amplification processing on the received radio-frequency signal that is input from the signal processing unit; and at least one auxiliary power amplifier, configured to operate or be disabled under the control of the auxiliary power amplifier control signal, and when in an operating state, perform amplification processing on the received radio-frequency signal that is input from the signal processing unit.

14 Claims, 3 Drawing Sheets

(51) Int. Cl.
   *H03F 3/19*     (2006.01)
   *H04B 1/40*     (2015.01)
   *H03F 3/189*    (2006.01)
   *H03F 3/24*     (2006.01)
   *H03F 3/60*     (2006.01)
   *H03F 3/72*     (2006.01)
   *H04W 88/08*    (2009.01)

(52) U.S. Cl.
   CPC ............... *H03F 3/19* (2013.01); *H03F 3/245* (2013.01); *H03F 3/602* (2013.01); *H03F 3/72* (2013.01); *H04B 1/40* (2013.01); *H03F 2200/451* (2013.01); *H03F 2203/7215* (2013.01); *H03F 2203/7221* (2013.01); *H03F 2203/7236* (2013.01); *H04W 88/08* (2013.01)

(58) Field of Classification Search
   CPC ....... H03F 2203/45116; H03F 3/45076; H03F 2200/222; H03F 2200/234; H03F 2203/45151; H03F 2203/45576; H03F 3/211; H03F 3/602; H03F 3/604; H03F 3/72; H03F 1/0288; H03G 1/0088; H03G 3/3036; H03H 11/245; H03H 11/0405; H03H 11/1217; H03M 1/0682; H03M 1/747; H03M 3/02; H03M 3/43; H03M 3/344; H03M 3/376; H03M 3/424; H03M 3/454; H03M 3/456; H03K 17/162; H03K 17/6871

USPC ... 330/107, 124 R, 127, 255, 269, 277, 279, 330/286, 295, 297, 307, 51; 333/32, 33, 333/124, 125; 455/127.1, 143
   See application file for complete search history.

(56) References Cited

U.S. PATENT DOCUMENTS

| | | | |
|---|---|---|---|
| 2007/0008032 A1 | 1/2007 | Kyu et al. | |
| 2009/0179703 A1 | 7/2009 | Takenaka | |
| 2009/0191826 A1 | 7/2009 | Takinami et al. | |
| 2010/0176885 A1* | 7/2010 | Kim | H03F 1/0261 330/295 |
| 2011/0298545 A1* | 12/2011 | Morimoto | H03F 1/0216 330/296 |
| 2013/0093511 A1* | 4/2013 | Baek | H03F 3/602 330/124 R |

FOREIGN PATENT DOCUMENTS

| | | |
|---|---|---|
| CN | 201426111 Y | 3/2010 |
| CN | 102064774 A | 5/2011 |
| EP | 1 492 228 A1 | 12/2004 |
| WO | WO 2013/006941 A1 | 1/2013 |

\* cited by examiner

POWER AMPLIFIER, TRANSCEIVER, AND BASE STATION

CROSS-REFERENCE TO RELATED APPLICATIONS

This application is a continuation of International Application No. PCT/CN2013/071333, filed on Feb. 4, 2013, which is hereby incorporated by reference in its entirety.

TECHNICAL FIELD

The present invention relates to wireless communications technologies, and in particular, to a power amplifier, a transceiver, and a base station.

BACKGROUND

A power amplifier is an indispensable part of a wireless base station, and the efficiency of the power amplifier is a decisive factor that affects the efficiency of the base station. Currently, to improve the utilization of a frequency spectrum, modulated signals of many different standards are used in wireless communication, and these modulated signals have different peak-to-average ratios. Signals with a high peak-to-average ratio have high requirements on the power amplifier of the base station, and therefore, to perform amplification processing on these signals with a high peak-to-average ratio without distortion, the power amplifier of the base station may use a power back-off method, which, however, leads to low efficiency. High-efficiency power amplifiers mainly include an envelope tracking amplifier and a Doherty (Doherty) power amplifier.

For the envelope tracking power amplifier, operating voltage of the amplifier is determined according to envelope amplitude of an output radio-frequency signal: When radio-frequency output power is low, a low voltage is used to supply power, and the voltage increases as the radio-frequency output power increases, so that the amplifier can operate in a near-saturation area corresponding to the corresponding power supply voltage for different power inputs, thereby reducing power loss, and improving power back-off efficiency. An advantage of the envelope tracking power amplifier lies in that, an envelope modulator is irrelevant to the radio-frequency operating frequency, and can achieve a wide radio-frequency operating bandwidth. However, the overall operating efficiency of the envelope tracking power amplifier is equal to a product of the operating efficiency of the envelope modulator and the operating efficiency of a radio-frequency power amplifier. Because the operating efficiency of the envelope modulator cannot be 100%, there is some loss in the overall operating efficiency of the envelope tracking power amplifier. Especially in a case in which a modulated signal has a wide bandwidth, the envelope modulator is not easily implemented, the efficiency decreases as envelope bandwidth increases, and the loss in the overall operating efficiency of the envelope tracking power amplifier is higher, and therefore it is very difficult to implement efficient power amplification of a modulated signal having a wide bandwidth.

The Doherty (Doherty) power amplifier improves the power back-off efficiency by using an active-load pulling method. That is, load impedance of a primary power amplifier of the Doherty power amplifier is pulled by an auxiliary power amplifier, so that the primary power amplifier can reach a saturated state in advance in a case of low input power and output power, and keep operating in the saturated state as the input power continues to increase, thereby improving the power back-off efficiency. The Doherty power amplifier does not have an envelope modulator, and therefore has a higher modulated signal bandwidth than that of the ET power amplifier. However, in the Doherty power amplifier, the combined output circuit design is relevant to the operating frequency, and after the operating frequency deviates from a set center frequency, the operating state deviates from the optimal active-load pulling state, which reduces the efficiency. Therefore, a wide radio-frequency operating bandwidth is not easily achieved.

SUMMARY

Embodiments of the present invention provide a power amplifier, a transceiver, and a base station, which are used to optimize operating performance of a power amplifier in the prior art.

According to a first aspect, an embodiment of the present invention provides a power amplifier, where the power amplifier includes:

a signal control unit, configured to generate a mode control signal and an auxiliary power amplifier control signal;

a signal processing unit, configured to separately process an envelope signal and a radio-frequency signal;

an envelope modulator, separately connected to the signal control unit and the signal processing unit, and configured to receive the mode control signal from the signal control unit and the envelope signal that has been processed by the signal processing unit, and output a fixed voltage or output an amplified envelope signal under the control of the mode control signal;

a primary power amplifier, connected to the envelope modulator and the signal processing unit, and configured to: by receiving, as an operating voltage, the fixed voltage or the envelope signal output by the envelope modulator, perform amplification processing on the received radio-frequency signal that is input from the signal processing unit; and at least one auxiliary power amplifier, connected with the primary power amplifier in parallel, separately connected to the envelope modulator and the signal processing unit, and configured to operate or be disabled under the control of the auxiliary power amplifier control signal, and when in an operating state, receive the fixed voltage or the envelope signal output by the envelope modulator and the radio-frequency signal that is input from the signal processing unit, and perform amplification processing on the received radio-frequency signal by using the received fixed voltage or envelope signal as an operating voltage.

In a first possible implementation manner of the first aspect, the auxiliary power amplifier control signal is a bias control signal, and the auxiliary power amplifier is connected to the signal control unit, and operates or is disabled under the control of the bias control signal.

In a second possible implementation manner of the first aspect, the auxiliary power amplifier control signal is a switch control signal, and the power amplifier further includes: at least one switch, disposed at an input end of the auxiliary power amplifier, connected to the signal control unit, and switched on or off under the control of the switch control signal.

With reference to the first aspect or any one of the first possible implementation manner of the first aspect and the second possible implementation manner of the first aspect, in a third possible implementation manner, the signal control unit and the signal processing unit are integrated in a baseband chip.

According to a second aspect, a transceiver is provided, where the transceiver includes the power amplifier provided in the first aspect or any one of the first and second possible implementation manners of the first aspect.

According to a third aspect, a base station is provided, where the base station includes the power amplifier provided in the first aspect or the first or second possible implementation manner of the first aspect or the transceiver provided in the second aspect.

In the power amplifier, the transceiver, and the base station that are provided in the embodiments of the present invention, the signal control unit controls the envelope modulator to output a fixed voltage to the primary power amplifier, and at the same time the signal control unit enables the auxiliary power amplifier to be in a class-C operating state. In this case, the primary power amplifier and the auxiliary power amplifier jointly constitute a Doherty, and enter a first operating mode. Further, the signal control unit enables the envelope modulator to output an envelope signal to the primary power amplifier, the primary power amplifier performs amplification processing, by using the envelope signal as an operating voltage of the primary power amplifier, on a radio-frequency signal that has been processed by the signal processing unit, and the signal control unit controls the auxiliary power amplifier to be biased in an operating state that is the same as that of the primary power amplifier. In this case, the primary power amplifier, the auxiliary power amplifier, and the envelope modulator jointly constitute an ET power amplifier, and enter a second operating mode. Therefore, switching between two operating modes can be implemented according to a signal amplification requirement, thereby optimizing the operating performance of the power amplifier.

BRIEF DESCRIPTION OF THE DRAWINGS

To describe the technical solutions in the embodiments of the present invention more clearly, the following briefly introduces the accompanying drawings required for describing the embodiments or the prior art. Apparently, the accompanying drawings in the following description show some embodiments of the present invention, and a person of ordinary skill in the art may still derive other drawings from these accompanying drawings without creative efforts.

DETAILED DESCRIPTION

To make the objectives, technical solutions, and advantages of the embodiments of the present invention clearer, the following clearly describes the technical solutions in the embodiments of the present invention with reference to the accompanying drawings in the embodiments of the present invention. Apparently, the described embodiments are some but not all of the embodiments of the present invention. All other embodiments obtained by a person of ordinary skill in the art based on the embodiments of the present invention without creative efforts shall fall within the protection scope of the present invention.

Figure 1:
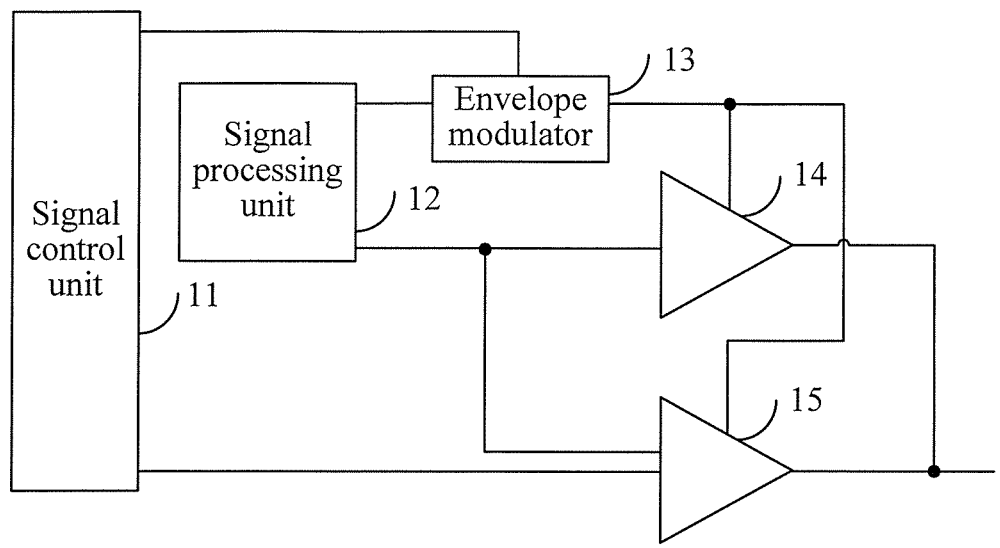
FIG. 1 is a schematic structural diagram of a power amplifier according to Embodiment 1 of the present invention.

FIG. 1 is a schematic structural diagram of a power amplifier according to Embodiment 1 of the present invention. The power amplifier provided in this embodiment of the present invention may be integrated in any network element device, such as a base station, that requires power amplification of wireless signals.

As shown in FIG. 1, the power amplifier provided in this embodiment of the present invention includes:

a signal control unit 11, configured to generate a mode control signal and an auxiliary power amplifier control signal;

a signal processing unit 12, configured to separately process an envelope signal and a radio-frequency signal;

an envelope modulator 13, separately connected to the signal control unit 11 and the signal processing unit 12, and configured to receive the mode control signal generated by the signal control unit 11 and the envelope signal that has been processed by the signal processing unit 12, and output a fixed voltage or output the amplified envelope signal under the control of the mode control signal;

a primary power amplifier 14, connected to the envelope modulator 13 and the signal processing unit 12, and configured to receive the fixed voltage or the envelope signal output by the envelope modulator 13 and the radio-frequency signal that is input from the signal processing unit 12, and perform amplification processing on the received radio-frequency signal by using the received fixed voltage or envelope signal as an operating voltage; and at least one auxiliary power amplifier 15, connected with the primary power amplifier 14 in parallel, separately connected to the envelope modulator 13 and the signal processing unit 12, and configured to operate or be disabled under the control of the auxiliary power amplifier control signal, and when in an operating state, receive the fixed voltage or the envelope signal output by the envelope modulator 13 and the radio-frequency signal that is input from the signal processing unit 12, and perform amplification processing on the received radio-frequency signal by using the received fixed voltage or envelope signal as an operating voltage.

Figure 2:
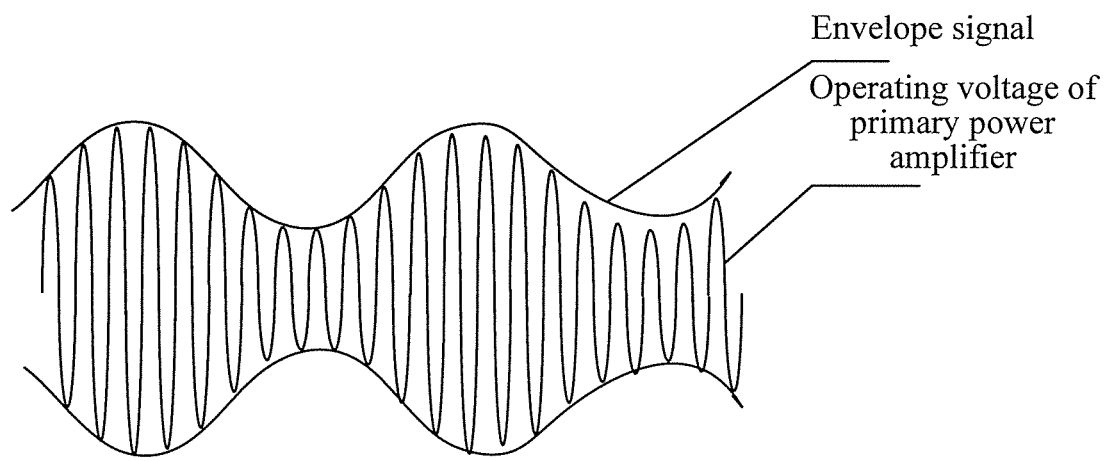
FIG. 2 is a schematic diagram of an envelope signal according to an embodiment of the present invention.

In the foregoing embodiment, the signal processing unit 12 may be implemented by a baseband chip, and can provide a radio-frequency signal and an envelope signal of the radio-frequency signal on the basis of the prior art. The so-called envelope signal is a signal that can track an operating voltage of the primary power amplifier, so that the primary power amplifier is always in a near-saturation operating state, as shown in FIG. 2. FIG. 2 is a schematic diagram of an envelope signal according to an embodiment of the present invention. The signal control unit 11 may also be integrated in a baseband chip, or independently disposed, and determines an appropriate operating mode by identifying a radio-frequency signal, for example, may determine, according to signal bandwidth and operating bandwidth of the radio-frequency signal, whether to change the operating status of the auxiliary power amplifier 15, or determine, according to an actual operating mode of the power amplifier, whether the envelope modulator 13 outputs a fixed voltage or an envelope signal as an operating voltage of the amplifier. Further, in an actual application, in a scenario in which the radio-frequency signal has a wide signal bandwidth, the power amplifier may be set to a Doherty power amplifier operating mode, and in this case, the auxiliary power amplifier is in a class-C operating state. In a scenario that requires the radio-frequency signal to have a wide operating bandwidth, the auxiliary power amplifier may be disabled, or set to an operating state that is the same as that of the primary power amplifier, and in this case, the power amplifier is in an ET power amplifier operating mode. When the envelope modulator outputs a fixed voltage as the operating voltage of the primary power amplifier, the power amplifier may enter the Doherty power amplifier operating mode; when the envelope modulator outputs an envelope signal as the operating voltage of the primary power amplifier, the power amplifier may enter the ET power amplifier operating mode.

The power amplifier provided in this embodiment can have two operating modes, that is, the Doherty power amplifier operating mode and the envelope tracking (ET) amplifier operating mode.

In this embodiment, the auxiliary power amplifier control signal generated by the signal control unit 11 may be an analog signal or may be a digital signal.

Specifically, the first operating mode is that: the mode control signal generated by the signal control unit 11 enables the envelope modulator 13 to output a fixed voltage to the primary power amplifier 14, and the auxiliary power amplifier control signal generated by the signal control unit 11 enables the auxiliary power amplifier 14 to be biased in the class-C operating state. In this case, the primary power amplifier 14 and the auxiliary power amplifier 15 constitute a standard Doherty power amplifier, and in this operating mode, the Doherty power amplifier can implement power amplification of a radio-frequency signal having a wide modulated signal bandwidth. In an actual application process, the implementation form of the Doherty power amplifier is not limited, and the first operating mode is also applicable to inverted Doherty and multi-channel Doherty power amplifiers.

Specifically, the second operating mode is that: the mode control signal generated by the signal control unit 11 enables the envelope modulator 13 to output an envelope signal to the primary power amplifier 14, the radio-frequency signal generated by the signal processing unit 12 is sent to the primary power amplifier 14 to enable the primary power amplifier 14 to be biased in a class-AB operating state, and the auxiliary power amplifier control signal generated by the signal control unit 11 enables the auxiliary power amplifier 15 to be biased in a class-AB operating state that is the same as that of the primary power amplifier 14. In this case, the primary power amplifier 14 and the auxiliary power amplifier 14 constitute a class-AB combined power amplifier, and the class-AB combined power amplifier and the envelope modulator 13 jointly constitute an ET power amplifier. In this operating mode, the ET power amplifier can implement power amplification of a radio-frequency signal having a narrow modulated signal bandwidth. The ET power amplifier can achieve a higher radio-frequency bandwidth than that of a Doherty power amplifier, and the ET power amplifier can improve the power back-off efficiency. Certainly, in the second operating mode, a conduction angle of the auxiliary power amplifier in the class-C operating state may also be reduced by using the auxiliary power amplifier control signal, so as to disable the auxiliary power amplifier 15. In this state, in the power amplifier, only the primary power amplifier performs amplification processing on the radio-frequency signal, so that the power amplifier can have higher back-off efficiency during low power output.

In the power amplifier that is provided in this embodiment of the present invention, the signal control unit controls the envelope modulator to output a fixed voltage to the primary power amplifier, and at the same time the signal control unit enables the auxiliary power amplifier to be in a class-C operating state. In this case, the primary power amplifier and the auxiliary power amplifier jointly constitute a Doherty, and enter a first operating mode. Further, the signal control unit enables the envelope modulator to output an envelope signal to the primary power amplifier, the primary power amplifier performs amplification processing, by using the envelope signal as an operating voltage of the primary power amplifier, on a radio-frequency signal that has been processed by the signal processing unit, and the signal control unit controls the auxiliary power amplifier to be biased in an operating state that is the same as that of the primary power amplifier. In this case, the primary power amplifier, the auxiliary power amplifier, and the envelope modulator jointly constitute an ET power amplifier, and enter a second operating mode. Therefore, switching between two operating modes can be implemented according to a signal amplification requirement, thereby optimizing the operating performance of the power amplifier.

Figure 3:
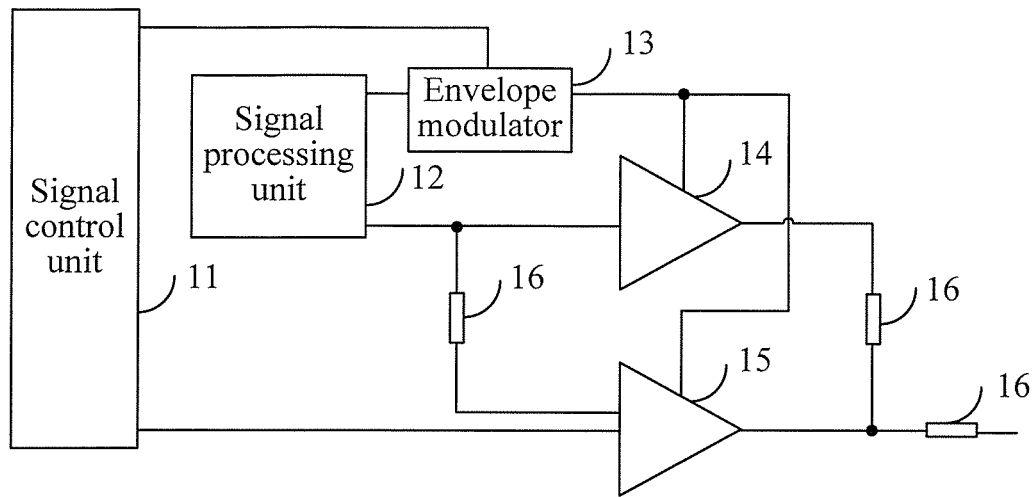
FIG. 3 is a schematic structural diagram of a power amplifier according to Embodiment 2 of the present invention.

On the basis of the foregoing embodiment, FIG. 3 is a schematic structural diagram of a power amplifier according to Embodiment 2 of the present invention. Preferably, as shown in FIG. 3, in an actual application, the power amplifier may further include: three quarter-wave transmission lines 16, which are separately connected between input ends, between output ends, and to a combined output end of the primary power amplifier 14 and the auxiliary power amplifier 15. The function of the three quarter-wave transmission lines connected between the input ends of the primary power amplifier 14 and the auxiliary power amplifier 15 is to provide a phase difference between the primary power amplifier 14 and the auxiliary power amplifier 15. In an actual application, a phase difference may also be provided between the primary power amplifier 14 and the auxiliary power amplifier 15 by using a coupler. Herein, the specific implementation form of the circuit is not limited.

In this embodiment, when the primary power amplifier and the auxiliary power amplifier constitute a Doherty power amplifier, not only the quarter-wave transmission lines may be used, but also a coupler may be used, so that the power amplifier provided in the present invention has a flexible configuration that can be selected according to an actual requirement.

On the basis of the foregoing embodiment, the auxiliary power amplifier control signal may include: a bias control signal or a switch control signal.

In this embodiment of the present invention, the bias control signal is an analog signal, and the switch control signal is a digital signal.

In this embodiment of the present invention, switching between the two operating modes can be implemented by using the bias control signal or the switch control signal. Therefore, the operating mode of the power amplifier can be switched freely according to an actual requirement.

On the basis of the foregoing embodiment, when the auxiliary power amplifier control signal is a bias control signal, the auxiliary power amplifier 15 may also be directly connected to the signal control unit 11, and operate in the class-AB operating state or the class-C operating state or be disabled under the control of the bias control signal. In the power amplifier provided in the present invention, the signal control unit 11 is used to control the auxiliary power amplifier 15 whether to operate, thereby implementing switching between the two operating modes of the power amplifier.

Figure 4:
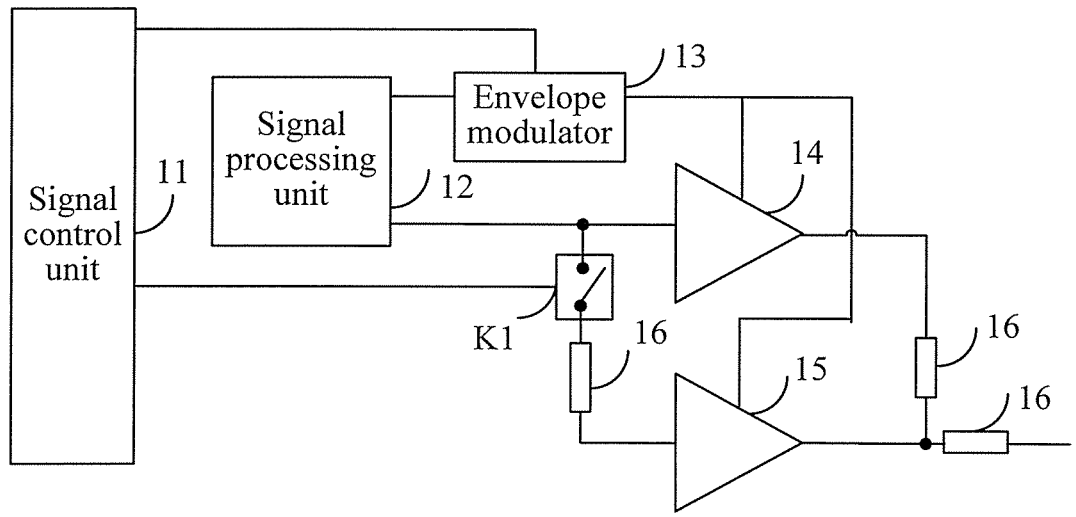
FIG. 4 is a schematic structural diagram of a power amplifier according to Embodiment 3 of the present invention.

FIG. 4 is a schematic structural diagram of a power amplifier according to Embodiment 3 of the present invention. As shown in FIG. 4, the auxiliary power amplifier control signal may be a switch control signal. On the basis of FIG. 3, the power amplifier provided in this embodiment of the present invention may further include at least one switch K1, which is disposed at an input end of the auxiliary power amplifier 15, connected to the signal control unit 11, and switched on or off under the control of the switch control signal.

Specifically, the switch K1 is disposed at the input end of the auxiliary power amplifier 15, and in an actual application, when the signal control unit 11 controls the switch K1 to be in an on state, the signal control unit 11 may control, by using the signal control unit 11, the envelope modulator 13 to output a fixed voltage. In this case, the primary power amplifier 14 and the auxiliary power amplifier 15 constitute a standard Doherty power amplifier, and the Doherty power amplifier can implement power amplification of a radio-frequency signal having a wider modulated signal bandwidth.

When the signal control unit 11 controls the switch K to be in an off state, and the signal control unit 11 controls the envelope modulator 13 to output the amplified envelope signal. In this case, the auxiliary power amplifier 15 does not operate because the switch K1 is switched off, and therefore the primary power amplifier 14 and the envelope modulator 13 constitute an ET power amplifier. The ET power amplifier can achieve a higher radio-frequency bandwidth than that of a Doherty power amplifier, and the ET power amplifier can improve the power back-off efficiency.

In the power amplifier provided in this embodiment of the present invention, the switch is switched on or off to control the auxiliary power amplifier to operate or be disabled, thereby implementing switching between two different operating modes, so that the power amplifier has a good flexibility.

Figure 5:
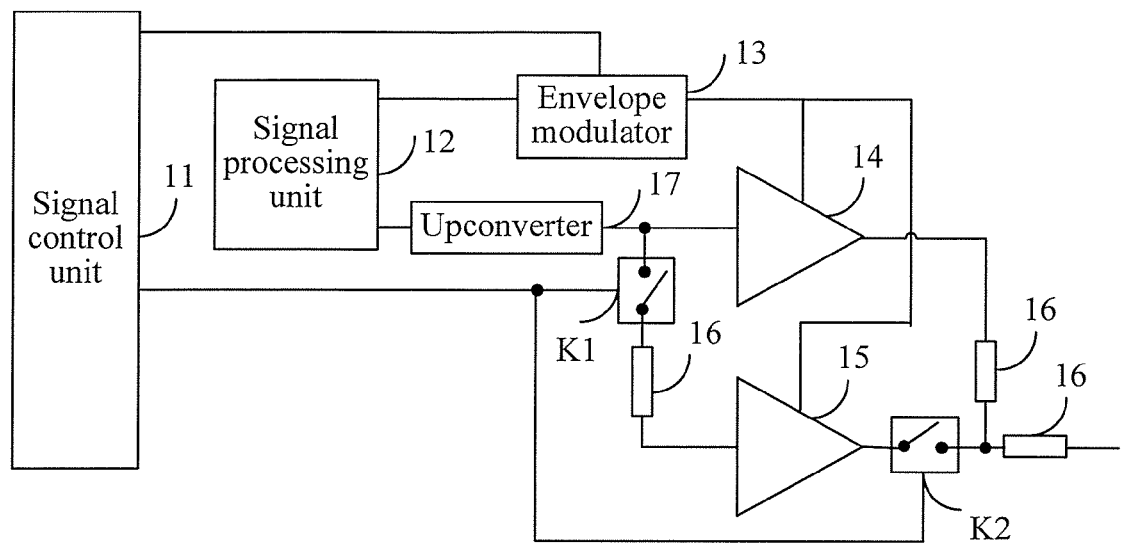
FIG. 5 is a schematic structural diagram of a power amplifier according to Embodiment 4 of the present invention.

FIG. 5 is a schematic structural diagram of a power amplifier according to Embodiment 4 of the present invention. As shown in FIG. 5, on the basis of the foregoing embodiments, preferably, the power amplifier provided in this embodiment of the present invention may further include: an upconverter 17, connected between the signal processing unit 12 and the primary power amplifier 14 and auxiliary power amplifier 15, and configured to perform frequency spectrum shifting on the radio-frequency signal.

In an actual application process, the upconverter 17 may perform signal frequency spectrum shifting on the radio-frequency signal generated by the signal processing unit 12, and then the radio-frequency signal on which the frequency spectrum shifting has been performed is sent to the primary power amplifier 14 and the auxiliary power amplifier 13.

Further, preferably, in FIG. 5, besides the switch K1 that is disposed at the input end of the auxiliary power amplifier 15, another switch K2 is disposed at an output end of the auxiliary power amplifier 15, and the switch K2 is also switched on or off under the control of the switch control signal.

In the power amplifier provided in this embodiment of the present invention, the upconverter is connected, so as to change the frequency of a baseband output signal to fall within operating frequency ranges of the primary power amplifier and the auxiliary power amplifier. In addition, because switches are disposed at both the output end and the input end of the auxiliary power amplifier, when the two switches are both switched off, the auxiliary power amplifier is completely isolated from the primary power amplifier, so that the power amplifier provided in this embodiment of the present invention not only can implement free switching between the two operating modes, but also can have a good power amplification effect when operating in the ET power amplifier mode.

Preferably, the signal control unit 11 and the signal processing unit 12 are integrated in a baseband chip.

In an actual application, the signal control unit 11 and the signal processing unit 12 are disposed in a baseband chip. The integration of the signal control unit 11 and the signal processing unit 12 in one baseband chip allows functions of the baseband chip to be more diversified, and avoids a management problem that occurs when the signal control unit 11 and the signal processing unit 12 are independently disposed, thereby facilitating centralized management.

An embodiment of the present invention further provides a transceiver, which may include the power amplifier that is provided in any one of the embodiments of the present invention.

An embodiment of the present invention further provides a base station, which may include the power amplifier that is provided in any one of the embodiments of the present invention or the transceiver in the foregoing embodiment.

For the base station provided in this embodiment of the present invention, because the power amplifier can switch the operating mode according to different application scenarios, the base station integrating the power amplifier that can switch the operating mode can also implement transmission of an amplified signal in different scenarios.

Finally, it should be noted that the foregoing embodiments are merely intended for describing the technical solutions of the present invention, but not for limiting the present invention. Although the present invention is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present invention.

What is claimed is:

1. A power amplifier, comprising:
   a signal processing unit, configured to separately process an envelope signal and a radio frequency signal;
   an envelope modulator, configured to receive the processed envelope signal and to output a fixed voltage under the control of an input mode control signal;
   an upconverter, operatively connected to the signal processing unit and configured to receive and perform frequency spectrum shifting on the processed radio frequency signal radio frequency signal;
   a primary power amplifier, configured to receive the fixed voltage output by the envelope modulator, and to perform amplification processing on the frequency-spectrum-shifted radio frequency signal by using the received fixed voltage as an operating voltage; and
   at least one auxiliary power amplifier, connected to the envelope modulator and connected with the primary power amplifier in parallel, configured to be in an operating state or a disabled state under control of an input control signal of auxiliary power amplifier, wherein when in the operating state, the at least one auxiliary power amplifier is configured to receive the fixed voltage output by the envelope modulator, and to perform amplification processing on the frequency-spectrum-shifted radio frequency signal by using the received fixed voltage as an operating voltage.

2. The power amplifier according to claim 1, wherein the input control signal of auxiliary power amplifier is a bias control signal, and the at least one auxiliary power amplifier is configured to be in the operating state or in the disabled state under the control of the bias control signal.

3. The power amplifier according to claim 1, wherein the control signal of auxiliary power amplifier is a switch control signal, and the power amplifier further comprises:
    at least one switch, disposed at an input end of the at least one auxiliary power amplifier, and configured to be switched on or off under the control of the switch control signal.

4. The power amplifier according to claim 1, further comprising:
    a first quarter-wavelength transmission line connected between an input end of the primary power amplifier and an input end of the auxiliary power amplifier, a second quarter-wavelength transmission line connected between an output end of the primary power amplifier and an output end of the auxiliary power amplifier, and a third quarter-wavelength transmission line connected to a combined output end of the primary power amplifier and the auxiliary power amplifier.

5. A transceiver, comprising:
    baseband chip, configured to provide a mode control signal, a radio frequency signal, and a control signal of auxiliary power amplifier, wherein the baseband chip includes a signal processing unit configured to separately process an envelope signal and the radio frequency signal;
    an envelope modulator, configured to receive the processed envelope signal and to output a fixed voltage under the control of the mode control signal provided by the baseband chip;
    an upconverter, configured to receive the processed radio frequency signal and perform frequency spectrum shifting on the processed radio frequency signal;
    a primary power amplifier, configured to receive the fixed voltage output by the envelope modulator, and to perform amplification processing on the frequency-spectrum-shifted radio frequency signal by using the received fixed voltage as an operating voltage; and
    at least one auxiliary power amplifier, connected to the envelope modulator and connected with the primary power amplifier in parallel, configured to be in an operating state or a disabled state under the control of the control signal of auxiliary power amplifier provided by the baseband chip, wherein when in the operating state, the at least one auxiliary power amplifier is configured to receive the fixed voltage outputted by the envelope modulator, and to perform amplification processing on the frequency-spectrum-shifted radio frequency signal provided by the baseband chip by using the received fixed voltage as an operating voltage.

6. The transceiver according to claim 5, wherein the control signal of auxiliary power amplifier is a bias control signal, and the at least one auxiliary power amplifier is configured to be in the operating state or in the disabled state under the control of the bias control signal.

7. The transceiver according to claim 5, wherein the control signal of auxiliary power amplifier is a switch control signal, and the power amplifier further comprises:
    at least one switch, disposed at an input end of the at least one auxiliary power amplifier, and configured to be switched on or off under the control of the switch control signal.

8. The transceiver according to claim 5, wherein the transceiver is arranged in a base station.

9. A power amplifier, comprising:
    an envelope modulator, configured to receive an envelope signal from a signal processing unit and output an amplified envelope signal under the control of an input mode control signal;
    an upconverter, configured to perform frequency spectrum shifting on a radio frequency signal received from the signal processing unit;
    a primary power amplifier, configured to receive the envelope signal output by the envelope modulator, and to perform amplification processing on the frequency-spectrum-shifted radio frequency signal by using an operating voltage in accordance with the envelope signal; and
    at least one auxiliary power amplifier, connected to the envelope modulator and connected with the primary power amplifier in parallel, configured to be in an operating state or a disabled state under the control of an input control signal of auxiliary power amplifier, wherein when in the operating state, the at least one auxiliary power amplifier is configured to receive the amplified envelope signal outputted by the envelope modulator, and to perform amplification processing on the frequency-spectrum-shifted radio frequency signal by using an operating voltage in accordance with the envelope signal.

10. The power amplifier according to claim 9, wherein the control signal of auxiliary power amplifier is a bias control signal, and the at least one auxiliary power amplifier is configured to be in the operating state or in the disabled state under the control of the bias control signal.

11. The power amplifier according to claim 9, wherein the control signal of auxiliary power amplifier is a switch control signal, and the power amplifier further comprises:
    at least one switch, disposed at an input end of the at least one auxiliary power amplifier, and configured to be switched on or off under the control of the switch control signal.

12. The power amplifier according to claim 9, further comprising:
    a first quarter-wavelength transmission line connected between an input end of the primary power amplifier and an input end of the auxiliary power amplifier, a second quarter-wavelength transmission line connected between an output end of the primary power amplifier and an output end of the auxiliary power amplifier, and a third quarter-wavelength transmission line connected to a combined output end of the primary power amplifier and the auxiliary power amplifier.

13. The power amplifier according to claim 9, wherein the power amplifier is arranged in a transceiver.

14. The power amplifier according to claim 13, wherein the transceiver is arranged in a base station.

* * * * *